(12) United States Patent
Iguchi

(10) Patent No.: US 6,376,363 B1
(45) Date of Patent: Apr. 23, 2002

(54) FORMING METHOD OF COPPER INTERCONNECTION AND SEMICONDUCTOR WAFER WITH COPPER INTERCONNECTION FORMED THEREON

(75) Inventor: Manabu Iguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 4 days.

(21) Appl. No.: 09/645,498

(22) Filed: Aug. 25, 2000

(30) Foreign Application Priority Data

Sep. 2, 1999 (JP) .............................. 11-248635

(51) Int. Cl.$^7$ ......................................... H01L 21/4763

(52) U.S. Cl. ...................... 438/633; 438/631; 438/622; 438/687

(58) Field of Search ................................ 438/622, 626, 438/631, 687, 633

(56) References Cited

U.S. PATENT DOCUMENTS

| | | | | |
|---|---|---|---|---|
| 5,505,779 A | * | 4/1996 | Mizuno et al. ............. | 118/719 |
| 5,953,634 A | * | 9/1999 | Kajita et al. ................ | 438/687 |
| 6,133,144 A | * | 10/2000 | Tsai et al. .................... | 438/634 |
| 6,149,730 A | * | 11/2000 | Matsubara et al. ......... | 118/728 |

FOREIGN PATENT DOCUMENTS

JP          06181263 A   * 12/1992

\* cited by examiner

*Primary Examiner*—Richard Elms
*Assistant Examiner*—Brad Smith
(74) *Attorney, Agent, or Firm*—McGinn & Gibb, PLLC

(57) ABSTRACT

In a wafer edge neighboring region 26, the circumference end part of a silicon oxide film 8 is set in an outer position than the circumference end part of a silicon oxide film 3 and thereby a structure in which polishing remains 21 generated in forming a copper interconnection comprising a copper film 6 and the like are covered with the silicon oxide film 8 is attained.

5 Claims, 19 Drawing Sheets

(a)

(b)

FORMING METHOD OF COPPER INTERCONNECTION AND SEMICONDUCTOR WAFER WITH COPPER INTERCONNECTION FORMED THEREON

BACKGROUND OF THE INVENTION

1. Field of the Invention

The present invention relates to a technique of forming a copper interconnection on a semiconductor wafer.

2. Description of the Related Art

In manufacturing a semiconductor device such as an IC (Integrated Circuit), an LSI (Large Scale Integrated Circuit) or the like, there are normally taken the steps of forming an insulating film on the surface of a semiconductor wafer such as a silicon wafer or the like, and thereafter forming, thereon, a photoresist patterned into a prescribed shape and carrying out the etching of the insulating film, using the photoresist as a mask. A trench or a hole required for formation of an interconnection, an interlayer via plug or such is formed through the steps of this sort.

Now, the formation of an insulating film and a metal film for an interconnection is performed over the entire surface of the wafer at a time so that these films are formed even in the area close to the wafer edge that is not utilized for chips. If the metal film and the insulating film are left behind in such an area, the peeling-off of the film may take place during the subsequent manufacturing steps, and, consequently, the contamination of the wafer and manufacturing apparatus may be brought about.

Further, the formation of the photoresist is also performed over the entire surface of the wafer, but the exposure for the resist is not applied to the area close to the wafer edge. As a result, in the case that a positive resist is used, the resist remains in the vicinity of the wafer edge even after the development. This remaining resist may cause the peeling-off of the film or the like, while transferring and holding the wafer, which leads to the contamination of the adjacent apparatus and the wafer surface and, consequently, a lowering of the production yield.

To overcome this problem, after the photoresist is formed and patterned into a prescribed shape, the step of removing the photoresist in the vicinity of the wafer edge is carried out. This prevents the contamination by the photoresist that is left in the vicinity of the wafer edge. Moreover, with the resist in the vicinity of the wafer edge being taken away, the insulating film and the like in this area can be removed by etching so that the contamination caused by the peeling-off of the insulating film and the like can be prevented.

When a positive resist is employed, the step of removing the photoresist in the vicinity of the wafer edge is normally carried out by means of peripheral exposure. That is, in addition to the exposure applied to the pattern formation region, the peripheral exposure of the wafer is performed to remove the unnecessary resist lying in the peripheral area. The peripheral exposure of the wafer is made, for example, while rotating the wafer that is coated with a resist so as to achieve the exposure of a ring-shaped neighbouring area of the wafer edge. FIG. 17 is a top plan view of a semiconductor wafer and, by the peripheral exposure, a wafer edge neighbouring area 50 is exposed and then removed by means of dissolution in a later step. Meanwhile, an unexposed area 51 including element formation regions remains, thereat, without being removed by dissolution. Further, the peripheral exposure can be performed along the whole circumference of the wafer or only a part of the wafer edge.

FIG. 18 is a series of schematic cross-sectional views showing the steps of a manufacturing method including the step of peripheral exposure. These steps are described below. Firstly, after a silicon oxynitride film 2 and a silicon oxide film 3 are formed, in this order, over an element formation layer 1 in which an element such as a transistor or the like is formed, a coating of a photoresist material is applied thereto and then dried (FIG. 18(a)). Next, through a mask patterned into a prescribed shape, an element formation region is subjected to exposure, whereby unexposed sections 4a and exposed sections 4b are formed therein (FIG. 18(b)). Subsequently, performing peripheral exposure, the silicon oxide film in the vicinity of the wafer edge (shown on the left side of the drawing) is made an exposed section 4b (FIG. 18(c)). After these exposures are made, the exposed sections 4b are removed by dissolution with a chemical solution. FIG. 19(a) shows the state after this removal is made. Now, using the photoresist 4 as a mask, dry etchings are carried out, whereby the silicon oxide film 3 is first removed and then the silicon oxynitride film 2 is removed. In etching these films, appropriate etching gases are used, respectively. FIG. 19(b) shows the state after the etchings are completed. After that, by ashing and a wet treatment with a resist peeling-off agent, the photoresist 4 is removed (FIG. 19(c)). Through the steps described above, there reaches the state in which the silicon oxide film 3 and the silicon oxynitride film 2 in the vicinity of the wafer edge are removed.

Next, referring to FIGS. 10 to 14, a conventional forming method of copper interconnections including the above steps of peripheral exposure is described below. Firstly, after a silicon oxynitride film 2 and a silicon oxide film 3 are formed, in this order, over an element formation layer 1 in which an element such as a transistor or the like is formed (FIG. 10(a)). In each drawing, there are shown an element formation region 25 and a wafer edge neighbouring region 26. The term a "wafer edge neighbouring region" 26 as used herein denotes a ring-shaped region along the wafer edge where no element formation is made. As against this, an "element formation region" 25 indicates a region that is situated inside of the wafer edge neighbouring region 26 and sectioned into with scribe lines. The wafer edge neighbouring area 50 and an area 51 including element formation regions have the positioning relation, for example, as shown in FIG. 17.

Next, a coating of a photoresist material is applied thereto and then dried. Next, through a mask patterned into a prescribed shape, an element formation region 25 is subjected to exposure, and then peripheral exposure is applied to the wafer edge neighbouring region 26. After these exposures are made, the exposed sections are removed by dissolution with a chemical solution. FIG. 10(b) shows the state after this removal is made. Now, using the photoresist 4 as a mask, dry etchings are carried out, whereby the silicon oxide film 3 is first removed and then the silicon oxynitride film 2 is removed. In etching these films, optimum etching gases are used, respectively. By these etchings, a trench for an interconnection is formed in the element formation region 25 and, at the same time, an insulating film and the like in the wafer edge neighbouring region 26 are removed. FIG. 10(c) shows the state after the etchings are completed. After that, by ashing and a wet treatment with a resist peeling-off agent, the photoresist 4 is removed.

Next, after a Ta (tantalum) film 5 is grown over the entire surface by the sputtering method, a copper film 6 is grown by the electroplating method, the CVD (Chemical Vapour Deposition) method or the like. (FIG. 11(a)). After these films are grown, superfluous portions of the copper film 6 and the Ta film 5 are removed, by polishing, using the CMP (Chemical Mechanical Polishing) so as to form a damascene interconnection (buried-type interconnection). In the vicinity of the wafer edge (the left end in the drawing), hereat, some of the copper film 6 and the Ta film 5 are left behind in a stepped part and polishing remains are generated (FIG. 11(b)).

Next, after a silicon oxynitride film 7 is grown over the entire surface of the wafer by the plasma CVD method or the like, a silicon oxide film 8 is grown by the plasma CVD method (FIG. 12(a)). Next, after a coating of a photoresist material is applied thereto and then dried, the exposure for patterning of the element formation region as well as the peripheral exposure are performed in the same way as the step shown in FIG. 10 (b). This forms a photoresist 9 into a shape, wherein openings are made in a prescribed position of the element formation region as well as over the wafer edge neighbouring area (FIG. 12(b)).

Using this photoresist 9 as a mask, dry etchings are carried out, whereby the silicon oxide film 8 is first removed and then the silicon oxynitride film 7 is removed (FIG. 12(c)). In etching these films, appropriate etching gases are used, respectively.

Next, after a Ti/TiN layered film 10 is grown over the entire surface by the sputtering method, a tungsten film 11 is grown by the electroplating method, the CVD method or the like. (FIG. 13(a)). After these films are grown, superfluous portions of the tungsten film 11 and the Ti/TiN layered film 10 are removed, by polishing, using the CMP so as to form an interlayer via plug. In the vicinity of the wafer edge, hereat, some of the tungsten film 11 and the Ti/TiN layered film 10 are left behind on the second step of a stepped part and polishing remains are generated. These polishing remains hardly bring about a problem of contamination or the like so that they are omitted from the drawings.

After that, in the same way as the steps described above, a silicon oxynitride film 12 and a silicon oxide film 14 are grown (FIG. 13(b)) and, over these films, a photoresist 20 is formed into a shape, wherein openings are made in a prescribed position of the element formation region as well as over the wafer edge neighbouring area (FIG. 13(c)). After that, using this photoresist 20 as a mask, dry etching is performed and thereby a recess section is formed in the element formation region and, at the same time, a silicon oxide film 14 and the like in the wafer edge neighbouring region are removed. Next, through the same steps a shown in FIG. 11(a) and (b), a copper interconnection is formed on the interlayer via plug that is made of a tungsten film 11 and a Ti/TiN layered film 10 (FIG. 13(d)).

When multi-layered interconnections are formed by the steps described above, however, there is left a layered body 23 of polishing remains with Ta films and copper films lying alternately in the vicinity of the wafer edge as shown in an encircled part of FIG. 13(d). Since the adhesion between copper and Ta is particularly weak, the peeling-off of the film takes place in the layered portion described above, and contamination of the wafer and apparatus may be brought about. Further, while a Ta film is formed as a barrier metal to cover lateral and bottom faces of a copper film in the steps described above, even when a film containing another material, for example, a titanium-containing film is employed, the adhesion between copper and barrier metal is similarly poor and causes contamination.

An example of formation of multi-layered interconnections, using a so-called single damascene process is described so far, but a similar problem arises when a dual damascene process is employed. FIG. 14 illustrates an example of a conventional method of forming multi-layered interconnections using a dual damascene process. Firstly, after a silicon oxynitride film 2 and a silicon oxide film 3 are formed over an element formation layer 1 in which an element (not shown in the drawing) such as a transistor or the like is formed, a copper interconnection comprising a Ta film 5 and a copper film 6 is formed (FIG. 14(a)). using the damascene process described above (FIG. 11). Polishing remains 21 is, hereat, generated in the wafer edge neighbouring area. Next, through etching, a sectionally T-shaped through hole is formed in the element formation region 25, and at the same time, a silicon oxide film 8 in the wafer edge neighbouring area is removed (FIG. 14(b)). After that, by carrying out the film growth and the CMP, a copper interconnection comprising a Ta film 18 and a copper film 19 is formed (FIG. 14(c)). In this case, too, a layered body 23 of polishing remains is generated in the wafer edge neighbouring area, causing a problem of contamination of the wafer and apparatus due to the peeling-off of the film.

The above problem does not arise when aluminum interconnections or copper-aluminum interconnections are employed. With aluminum interconnections or such, the peeling-off of the film hardly occurs even if etching residues of these films are generated in the vicinity of the wafer edge, owing to the good adhesion between the interconnection material and barrier metal. Referring to cross-sectional views of FIG. 16, this point is described further below.

FIG. 16(a) is a view showing the state at which a copper-aluminum interconnection (a lower-layer interconnection) comprising a Ti-based film 32, a copper-aluminum film 33 and a Ti-based film 34 is formed and thereafter, over that, an interlayer insulating film 36 is grown and then a through hole is formed. Following this, a Ti/TiN layered film 38 and a tungsten film 39 are grown (FIG. 16(b)), and then a copper-aluminum interconnection (an upper-layer interconnection) comprising a Ti-based film 32, a copper-aluminum film 33 and a Ti-based film 34 is formed (FIG. 16(c)). Although etching residues of the lower-layer interconnection and the upper-layer interconnection are, hereat, generated in a stepped part in the vicinity of the wafer edge (the left side of the drawings), these etching residues hardly cause the peeling-off of the film or bring about a problem of contamination or the like, because of the good adhesion between the copper-aluminum film and the Ti-based film.

SUMMARY OF THE INVENTION

The afore-mentioned problem of the contamination caused by the peeling-off of the film within de posit left in the vicinity of the wafer edge has not, hitherto, drawn much attention, and consequently the measures against this problem have been hardly taken. However, as the semiconductor device achieves a further miniaturization and attains a better performance capability, measures against such a problem have gained in importance. Further, in recent years, demands for a multi-layered interconnection structure have risen considerably. Yet, there remains the problem of the peeling-off of the film that becomes even more pronounced when two or more layers and particularly three or more layers of copper interconnections constitute a multi-layered interconnection structure, since a layered body of polishing remains becomes also multi-layered in such a case.

An object of the present invention is to solve a problem specific to such a forming method of a copper interconnection. Accordingly, an object of the present invention is to prevent deposition of a copper film and a barrier metal in the vicinity of the wafer edge, in forming a copper interconnection, and particularly in forming multi-layered interconnection with a structure wherein multi-layers of copper interconnections are laid, and thereby prevent contamination of the wafer and apparatus which may be caused by the peeling-off of the film.

In light of the above problems, the present invention provides a method of forming a copper interconnection; which comprises the steps of (a) forming a first insulating film on the entire surface of a semiconductor wafer, and thereafter, together with forming a trench within the first insulating film by etching, removing a portion of the first insulating film along the circumference end part of the semiconductor wafer so as to make the circumference end part of the first insulating film recede inside of the circumference end part of the wafer;

(b) forming a barrier metal film and a copper film, in this order, over the entire surface of the semiconductor wafer and thereafter polishing these films by means of chemical mechanical polishing, and thereby forming a copper interconnection in said trench; and (c) forming a second insulating film on the entire surface of the semiconductor wafer, and thereafter,. removing a portion of the second insulating film along the circumference end part of the semiconductor wafer so as to make the circumference end part of the second insulating film recede inside of the circumference end part of the wafer; wherein:

the circumference end part of the second insulating film after the completion of step (c) is made to be placed in an outer position than the circumference end part of the first insulating film after the completion of step (a).

This forming method of a copper interconnection makes the circumference end part of the second insulating film after the completion of step (c) placed in an outer position than the circumference end part of the first insulating film after the completion of step (a). This allows of providing a structure in which the polishing remains of a barrier metal film and the copper film that are generated in the vicinity of the wafer edge in performing step (b) are covered with the second insulating film. As a result, contamination caused by the peeling-off of the film that may occur within these polishing remains can be prevented with effect. In the above method of forming a copper interconnection, the circumference end part of each insulating film is made to recede inside of the circumference end part of the wafer in step (a) and (c). These steps can be carried out, for example, by removing a portion of the photoresist in the vicinity of the wafer edge by peripheral exposure or the like so as to form an opening, and thereafter applying etching over the insulating film. In such a method, in order to make the circumference end part of the second insulating film after the completion of step (c) placed in an outer position than the circumference end part of the first insulating film after the completion of step (a), the width of the opening of the photoresist in the vicinity of the wafer edge formed by removing the second insulating film should be made smaller than the width of the opening of the photoresist in the vicinity of the wafer edge formed by removing the first insulating film. Meanwhile, within the second insulating film, a via plug to connect with a copper interconnection can be set appropriately.

In the above method of forming a copper interconnection, if steps (a) to (c) are repeated twice or more times, the effect of the present invention becomes more significant. As the semiconductor device achieves a further miniaturization and attains a better performance capability, demands for a multi-layered interconnection structure have risen considerably, in recent years. However, as described in the section Prior Art, to form a multi-layered interconnection, there has been, hitherto, a problem that a layered body 23 of polishing remains is generated in the wafer edge neighbouring area as shown in FIG. 13(d). In contrast with this, the present invention makes the circumference end part of the second insulating film after the completion of step (c) placed in an outer position than the circumference end part of the first insulating film after the completion of step (a) so that a structure in which polishing remains generated in forming a lowerlayer copper interconnection and polishing remains in forming an upper-layer copper interconnection are separated by an insulating film can be attained. Therefore, generation of the layered body of the polishing remains can be prevented. The problem of the peeling-off of the film becomes very pronounced when two or more layers and particularly three or more layers of polishing remains form a multi-layered body. Consequently, when the present invention is applied to the formation of a multi-layered interconnection structure for which steps (a) to (c) are required to be repeated twice or more times and particularly thrice or more times, the effect of the present invention becomes more significant. Further, when the steps (a) to (c) are repeated twice or more, as described above, if the circumference end part of the second insulating film after the completion of step (c) is made to be placed in an outer position than the circumference end part of the first insulating film after the completion of step (a) that is performed immediately after said step (c), the area of the element formation region can be made larger in the result, which is preferable in view of the layout efficiency of the wafer.

Further, the present invention provides a semiconductor wafer, which comprises:

a first insulating film in which a copper interconnection is set; and a second insulating film in which a via plug to connect with said copper interconnection is set, with a first insulating film and a second insulating film being laid in alternate order on the main surface of the wafer; wherein:

said copper interconnection comprises a copper film and a barrier metal film wrapping the lateral and bottom faces of said copper film; and the circumference end part of the second insulating film is placed in an outer position than the circumference end part of the first insulating film.

In this semiconductor wafer, the circumference end part of the second insulating film is placed in an outer position than the circumference end part of the first insulating film. This allows of providing a structure in which the polishing remains that are generated in forming a copper interconnection are covered with the second insulating film and, therefore, contamination caused by the peeling-off of the film that may occur within these polishing remains can be prevented with effect.

Further, in the semiconductor wafer, if two or more layers and particularly three or more layers of the firs insulating films and the second insulating films each are laid in alternate order, the effect of the present invention becomes more significant. This results from the fact that, in this way, there can be attained a structure in which polishing remains generated in forming a lower-layer copper interconnection and polishing remains generated in forming an upper-layer copper interconnection are separated by an insulating film so that a layered body of the polishing is hardly generated. Moreover, herein, in a structure wherein two or more layers of the first insulating films and the second insulating films each are laid, if it is arranged that the circumference end part of the second insulating film is placed in an outer position than the circumference end part of the first insulating film that is formed immediately above the second insulating film, the area of the element formation region can be made larger in the result, which is preferable in view of the layout efficiency of the wafer.

In the present invention, the barrier metal film is preferably i) a film containing tantalum, for example, a tantalum film, a tantalum nitride film or a layered film of these films; or ii) a film containing titanium, for example, a titanium film, a titanium nitride film, or a layered film of these films. When a tantalum-containing film or a titanium-containing film is utilized as a barrier metal film of the copper interconnection, although it functions as an excellent barrier, it has, hitherto, a problem such that the peeling-off of the film becomes liable to happen if polishing remains are generated in the vicinity of the wafer edge owing to its poor adhesion with the copper film. Since the present invention can effectively overcome a problem of peeling-off of the film, the above film containing either tantalum or titanium that has excellent characteristics can be utilized without causing a problem in the manufacturing process.

In a forming method of an interconnection according to the present invention, a distance between the circumference end part of the second insulating film after the completion of step (c) and the circumference end part of the first insulating film after the completion of step (a) is preferably not less than 1 mm.

Further, in a semiconductor wafer according to the present invention, a distance between the circumference end part of the second insulating film and the circumference end part of the first insulating film that is formed immediately below said second insulating film is preferably not less than 1 mm. In this manner, the polishing remains present in the vicinity of the wafer edge can be covered satisfactorily with an insulating film so that the problem of peeling-off of the film can be prevented more effectively. Further, the upper limit is not specifically set, but 5 mm or so is more than enough to solve the problem of peeling-off of the film. In this way, the reduction of the layout efficiency of the wafer can be restrained.

DETAILED DESCRIPTION OF THE PREFERRED EMBODIMENTS

Figure 1:
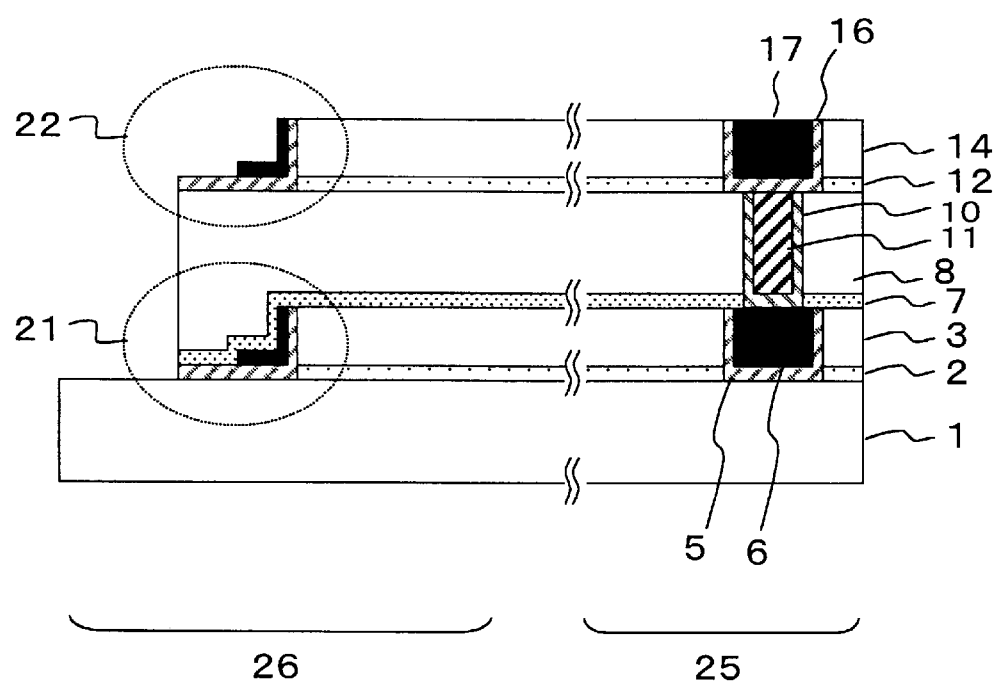
FIG. 1 is a schematic cross-sectional view showing the structure of a semiconductor wafer of the present invention.

FIG. 1 is a cross-sectional view showing one example of a structure of a semiconductor wafer according to the present invention. An element formation layer 1 is a layer of a silicon oxide film in which an element (omitted from the drawings) such as a transistor or the like is formed. Over this element formation layer 1, layers of a silicon oxynitride film 2, a silicon oxide film 3, a silicon oxynitride film 7, a silicon oxide film 8, a silicon oxynitride film 12 and a silicon oxide film 14 are formed.

Figure 17:
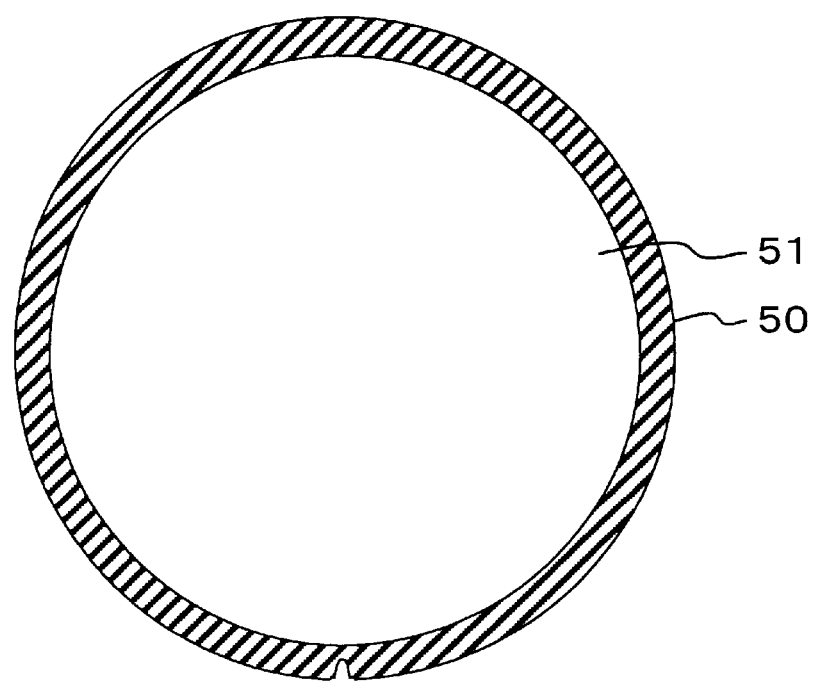
FIG. 17 is a top plan view of a semiconductor wafer showing the positioning relation between the wafer edge neighbouring area and the area including element formation regions.
Figure 18:
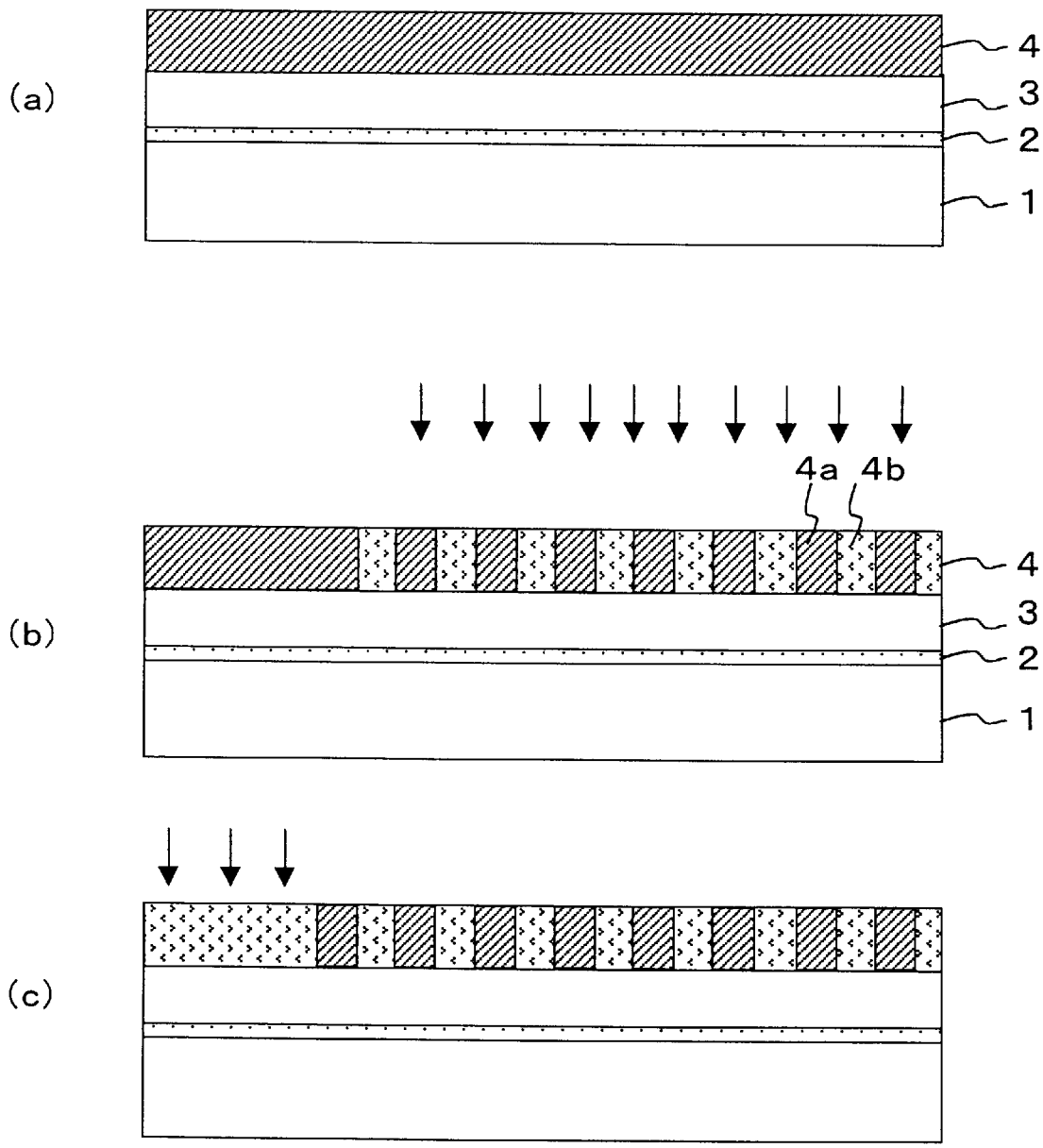
FIG. 18 is a series of schematic cross-sectional views illustrating the steps of peripheral exposure.
Figure 19:
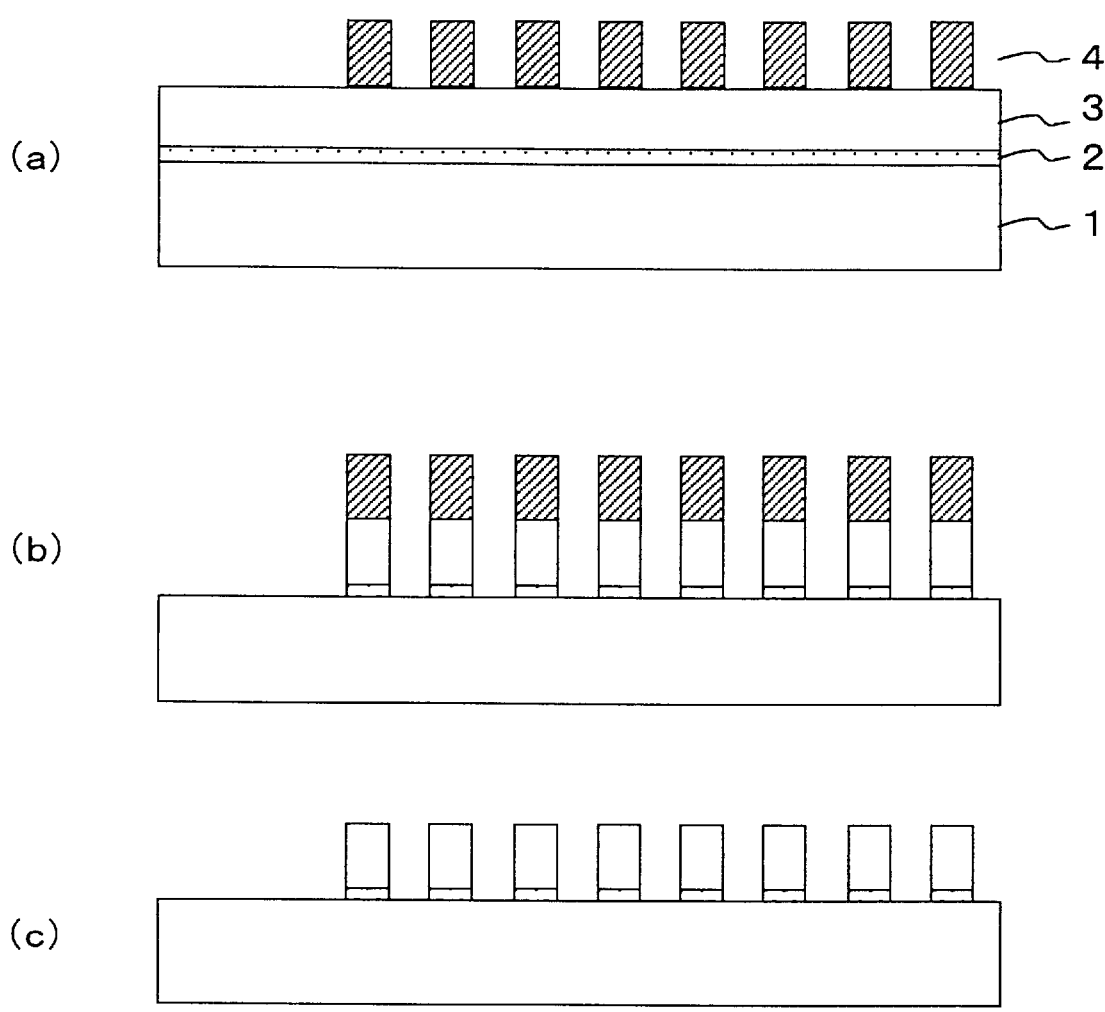
FIG. 19 is a series of schematic cross-sectional views illustrating further steps of peripheral exposure.

In each drawing, there are shown an element formation region 25 and a wafer edge neighbouring region 26. The term a "wafer edge neighbouring region" 26 as used herein denotes a ring-shaped region along the wafer edge where no element formation is made. As against this, an "element formation region" 25 indicates a region that is situated inside of the wafer edge neighbouring region 26 and sectioned into with scribe lines. The wafer edge neighbouring area 50 and an area including element formation regions have the positioning relation, for example, as shown in FIG. 17.

Now, in FIG. 1, in the element formation region 25, there is formed a structure in which multi-layers of copper interconnections are lying. Within the silicon oxide film 3, a first copper interconnection is formed. The first copper interconnection comprises a tantalum film 5 and a copper film 6. Within the silicon oxide film 8, an interlayer via plug connecting with the top surface of the first copper interconnection is formed. The interlayer via plug comprises a barrier metal film 10 made of Ti/TiN ad a tungsten film 11. Within the silicon oxide film 14, a second copper interconnection connected with the top surface of the interlayer via plug is formed. The second copper interconnection comprises a tantalum film 16 and a copper film 17.

Figure 13:
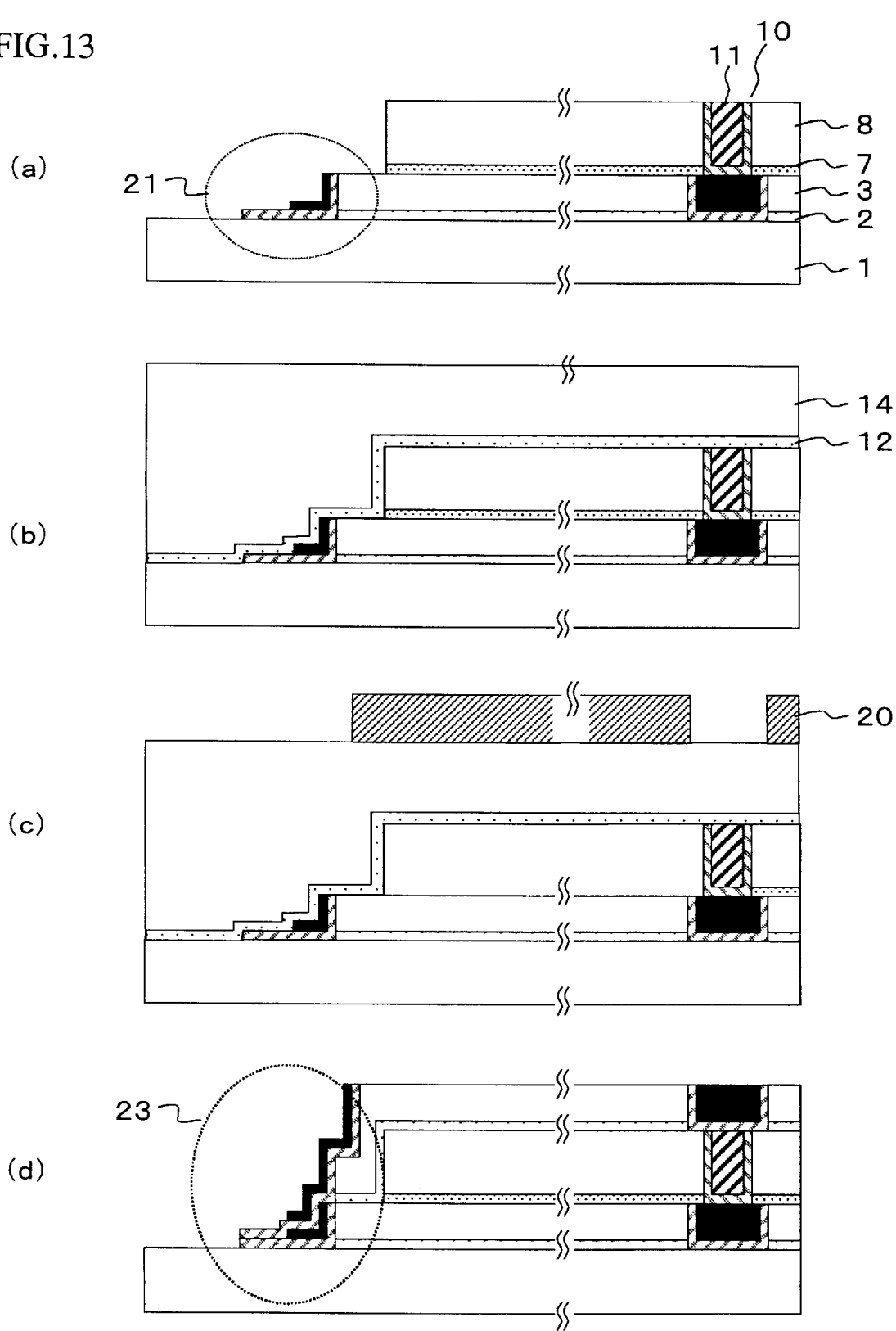
FIG. 13 is a series of schematic cross-sectional views illustrating further steps of the conventional forming method of copper interconnections.
Figure 14:
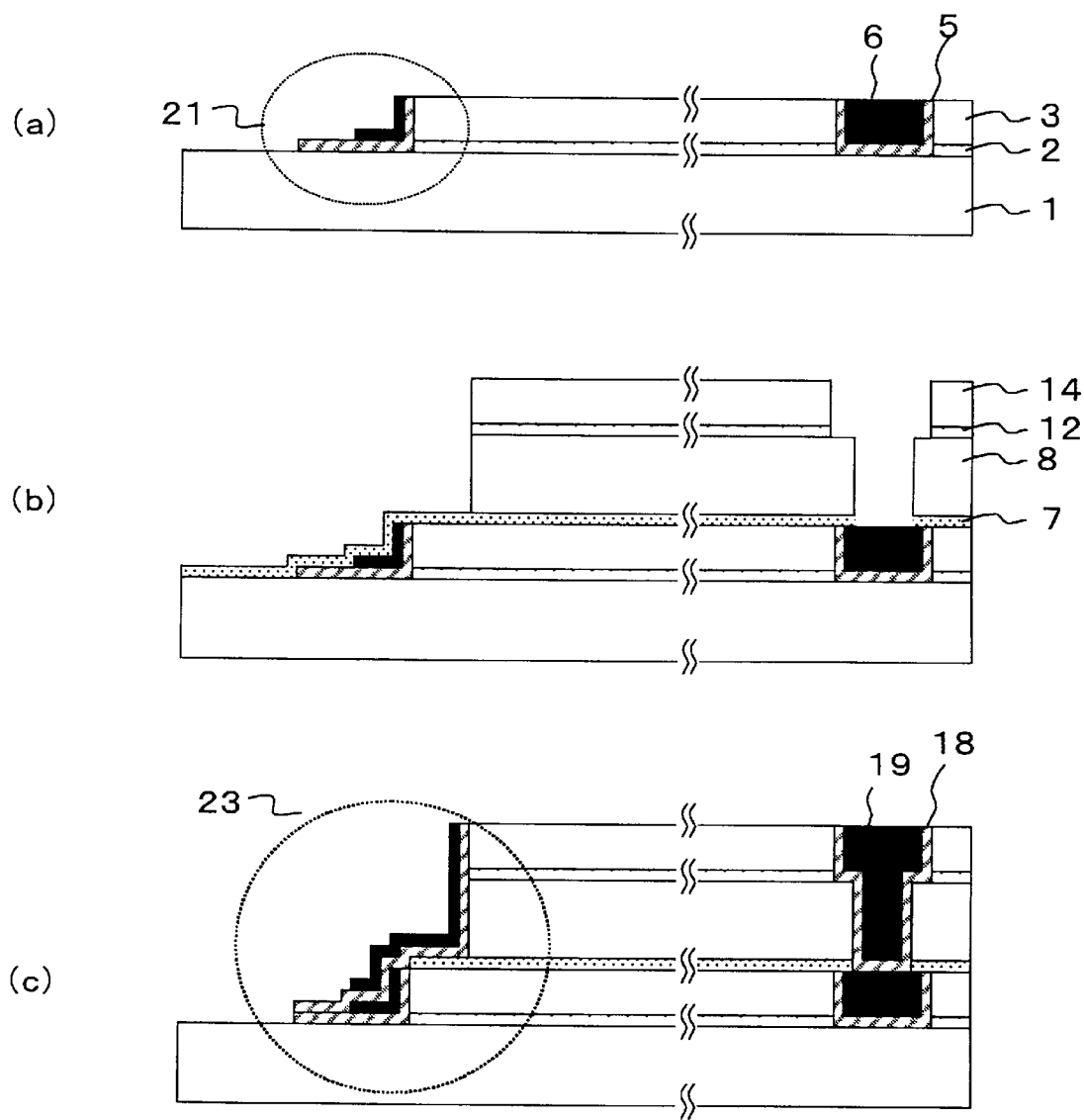
FIG. 14 is a series of schematic cross-sectional views illustrating the steps of another conventional forming method of copper interconnections.

Meanwhile, in the wafer edge neighbouring region 26, polishing remains 21 and 22 of the tantalum film and the copper film are left behind. In contrast with the polishing remains in the prior art that have such a layered structure as shown in FIG. 13(d), the polishing remains 21 and 22 in a semiconductor wafer of the present invention have a structure in which no direct connection is made to each other, with the silicon oxide film 8 separating these polishing remains 21 and 22. Furthermore, the polishing remains of the lower layer 21 are buried in the silicon oxide film 8 in form. As a result, the present invention can prevent deposition of the copper film and the barrier metal in the vicinity of the wafer edge and thereby prevent contamination which is caused by the peeling-off of the film.

Figure 2:
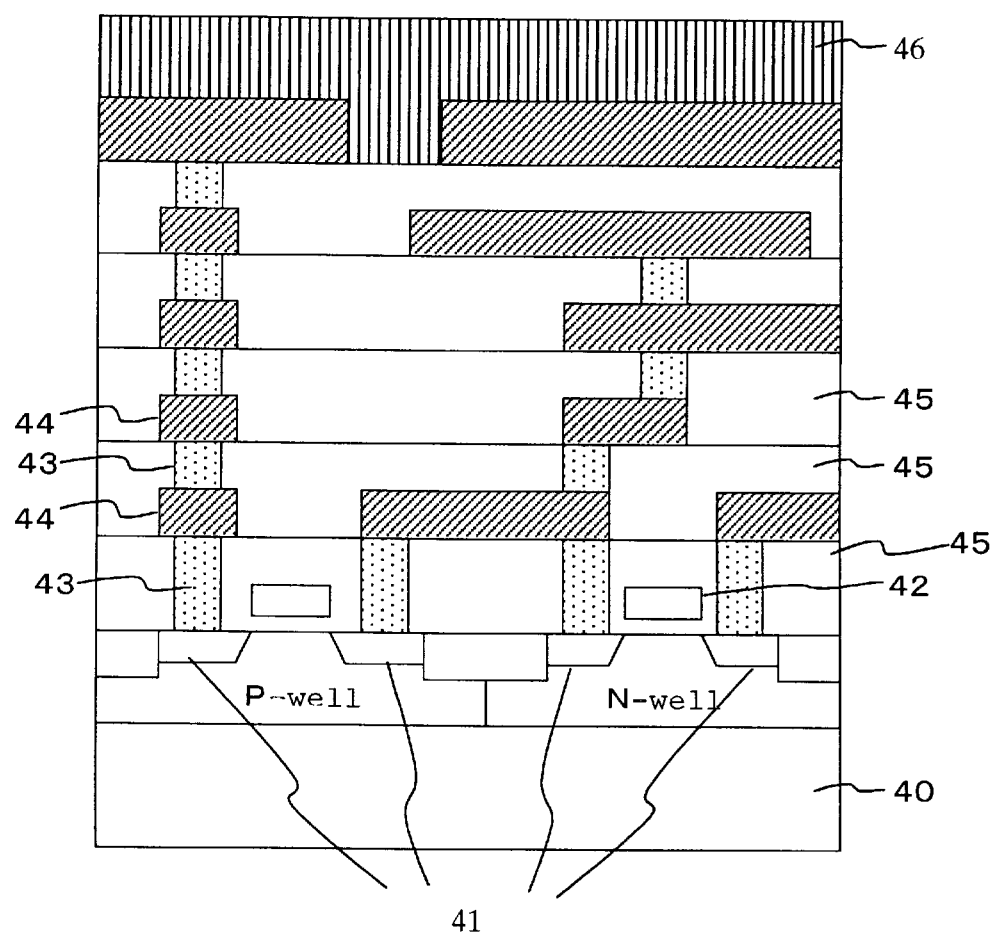
FIG. 2 is a schematic cross-sectional view showing the structure of multi-layered interconnections.
Figure 3:
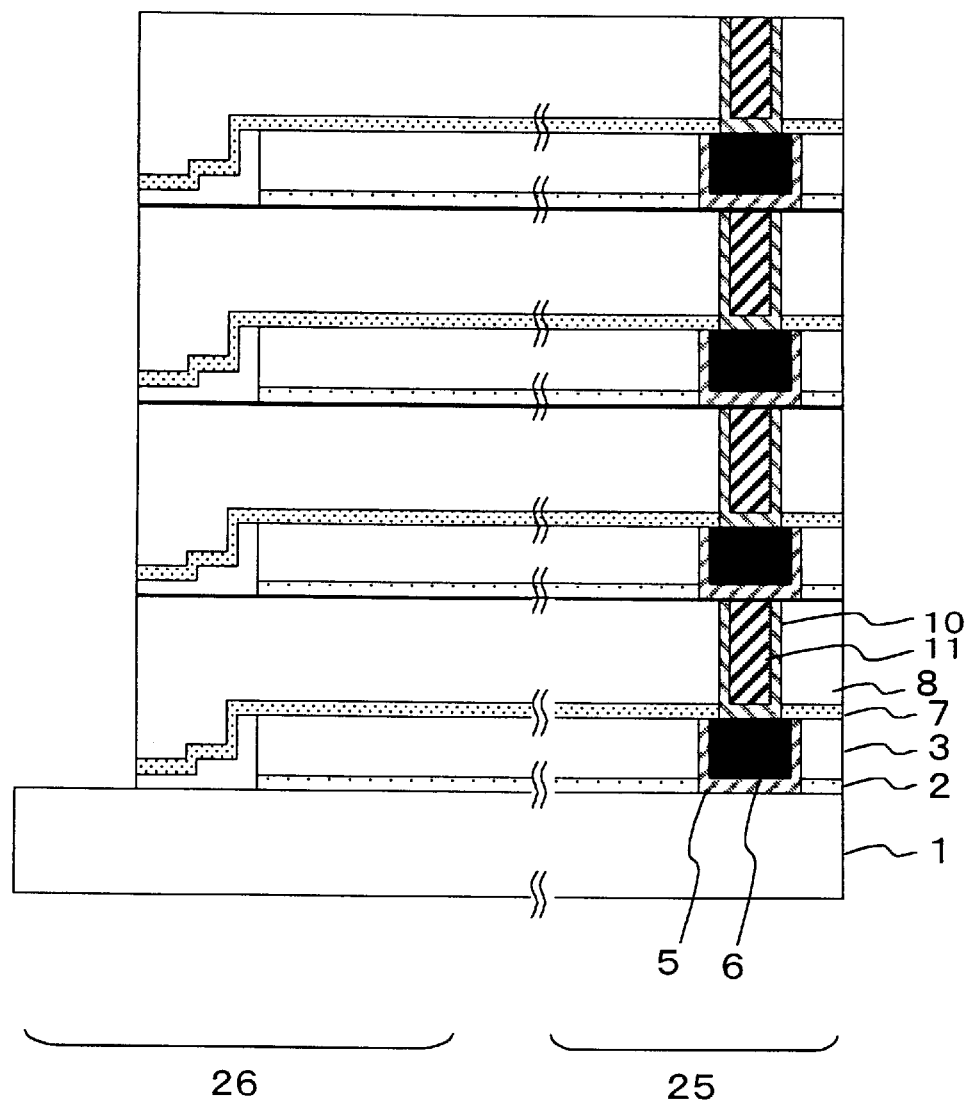
FIG. 3 is a schematic cross-sectional view showing the structure of a semiconductor wafer of the present invention.

The above description, with reference to FIG. 1, is made, taking an interconnection structure wherein two layers of copper interconnections are formed as an example. In a logic device or the like, however, three to five layers of interconnection layers are often set, as shown in FIG. 2. Here, a transistor comprising gate electrodes 42 and dopant diffusion layers 41 is formed in a first layer (an element formation layer) lying over a silicon substrate 40, and , over that, there are set these multi-layered interconnections with a structure in which each layer of a copper interconnection 44 that is set within an interlayer insulating film 45 are laid one upon another. Each copper interconnection is connected with another through an interlayer via plug 43. The present invention produces more marked effect when applied to a multi-layered copper interconnection with three or more layers. For the multi-layered interconnections with three or more layers, the layered body of the copper films and the barrier metal films generated in the vicinity of the wafer edge also becomes comprising three or more layers and liable to give rise to the peeling-off of the film. FIG. 3 shows an example of the present invention that is applied to such multi-layered interconnections. In the element formation region 25 therein, there are laid four layers of copper interconnections each layer of which comprises a Ta film 5 and a copper film 6. Each copper interconnection is connected with another through an interlayer via plug comprising a barrier metal film 10 and a tungsten film 11.

In the wafer edge neighbouring region 26, this semiconductor wafer has a structure in which polishing remains of the copper film 6 and the barrier metal film 5 are covered with a silicon oxide film 8 in respective layers so that the peeling-off of the film that may occur within these polishing remains can be prevented with effect.

Figure 4:
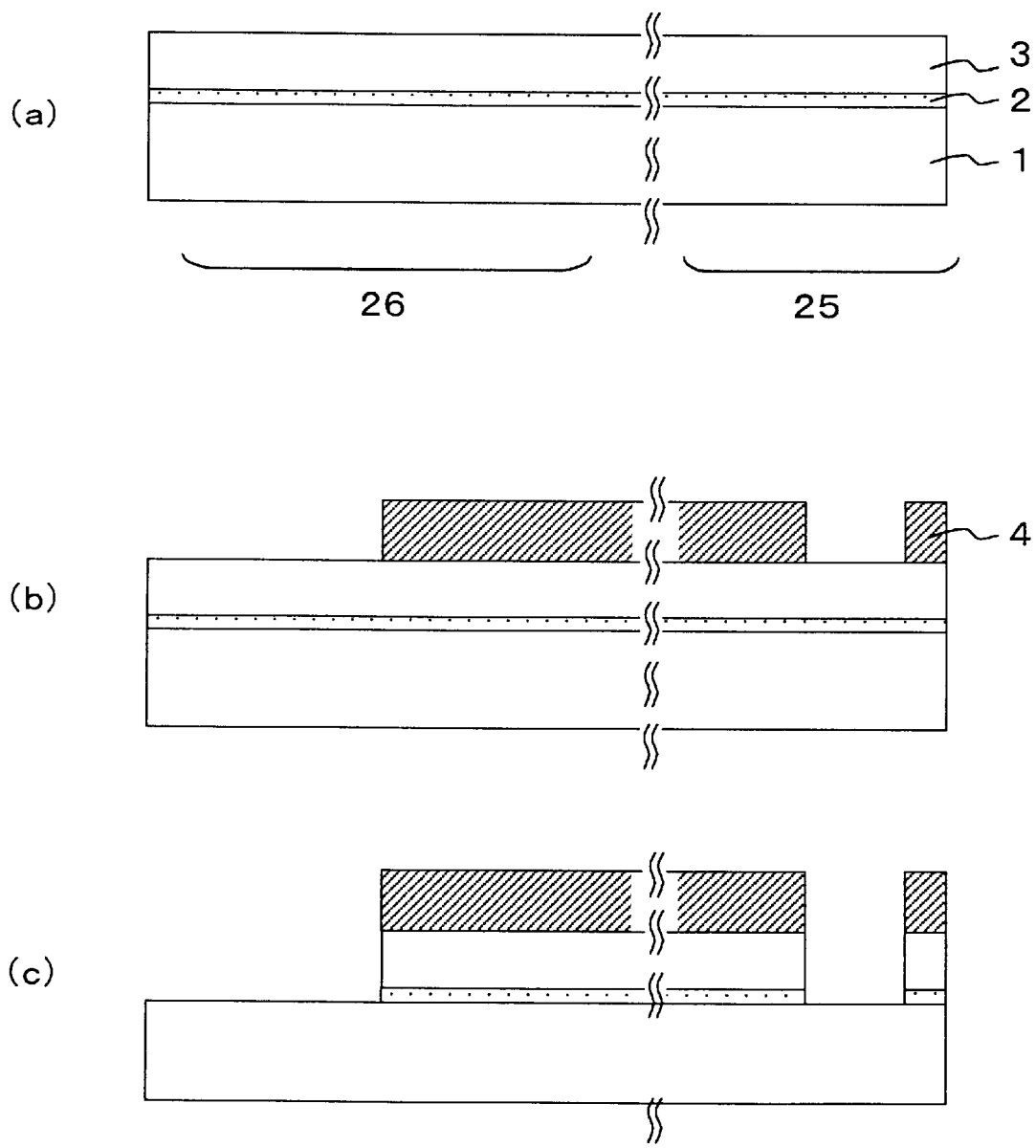
FIG. 4 is a series of schematic cross-sectional views illustrating the steps of a forming method of copper interconnections according to the present invention.

Next, referring to FIGS. 4 to 9, an example of a method of manufacturing the semiconductor wafer of FIG. 1 is described below. Firstly, over an element formation layer 1 in which an element (omitted from the drawings) such as a transistor or the like is formed, a silicon oxynitride film 2 is formed by the CVD method or the like to a thickness of 50 nm or so. A silicon oxide film 3 is then formed by the CVD method or the like to a thickness of 300 to 900 nm or so (FIG. 4(a)). Next, a coating of a photoresist material is applied over the silicon oxide film 3 and then dried. Next, through a mask patterned into a prescribed shape, an element formation region is subjected to exposure, and then peripheral exposure is performed. The exposure applied to the element formation region and the peripheral exposure may be carried out in this order or in the reverse order. After these exposures are made, the exposed sections are removed by dissolution with a chemical solution. FIG. 4(b) shows the state after this removal is made. The width of the area subjected to the peripheral exposure is set appropriately, depending on the individual conditions, but, for example, 2 to 5 mm or so from the wafer edge may be chosen.

Next, using the photoresist 4 as a mask, dry etchings are carried out and the silicon oxide film 3 is removed by etching. As an etching gas a gas that can etch the silicon oxide film 3 faster than the silicon oxynitride film 2 is employed. In this way, the silicon oxynitride film 2 is made to function as an etching stopper. After etching of the silicon oxide film 3 is completed another etching is carried out, using a gas that can etch the silicon oxynitride film 2 faster than the silicon oxide film 3, with the photoresist 4 being kept as it is. The silicon oxynitride film is, by this etching, is removed (FIG. 4(c)). After completion of etching, by performing a wet treatment with a resist peeling-off agent or the like, the photoresist 4 is removed. A trench for formation of an interconnection is formed in the element formation region 25 through the above etching step. In practice, a plurality of trenches are set therein for formation of interconnections and the widths of these interconnections vary according to the role of each interconnection, but generally are in the range of 0.2 to 1 μm.

Next, a Ta film 5 is grown over the entire surface by the sputtering method. The film thickness of the Ta film 5 is set to be 10 to 50 nm. Subsequently, a copper film 6 is grown by the electroplating method, the CVD method or the like. (FIG. 5(a)). When the electroplating method is employed, a copper film to serve as a seed layer is formed thereon by the sputtering method, and thereafter, by immersion into an electroplating solution, a copper-plating film is formed. The thickness of the copper film 6 is, for example, set to be 500 to 800 nm in the flat section.

After the copper film is grown, superfluous portions of the copper film 6 and the Ta film 5 are removed, by polishing, using the CMP so as to form a damascene interconnection within the recess section set in the element formation region (FIG. 5(b)). In the vicinity of the wafer edge (the left end in the drawing), hereat, some of the copper film 6 and the Ta film 5 are left behind in a stepped part and generates the polishing remains.

Next, after a silicon oxynitride film 7 (with a film thickness of 50 nm or so) is grown over the entire surface of the wafer by the plasma CVD method or the like, a silicon oxide film 8 (with a film thickness of 700 nm or so) is grown by the plasma CVD method (FIG. 6(a)). Next, after a coating of a photoresist material is applied thereto and then dried, the exposure for patterning of the element formation region as well as the peripheral exposure are performed in the same way as the step shown in FIG. 4(b). This forms a photoresist 9 into a shape, wherein openings are made in a prescribed position of the element formation region as well as over the wafer edge neighbouring area (FIG. 6(b)). Using this photoresist 9 as a mask, dry etchings are carried out, whereby the silicon oxide film 8 is first removed and then the silicon oxynitride film 7 is removed. By the above steps of etching, there is provided a structure wherein a layer of a silicon oxide film 8 is laid over polishing remains 21 in the vicinity of the wafer edge, while there is formed an interlayer via hole in the element formation region 25 (FIG. 6(c)). The aperture of the interlayer via hole is , for example, set to be not greater than 0.3 μm.

Figure 12:
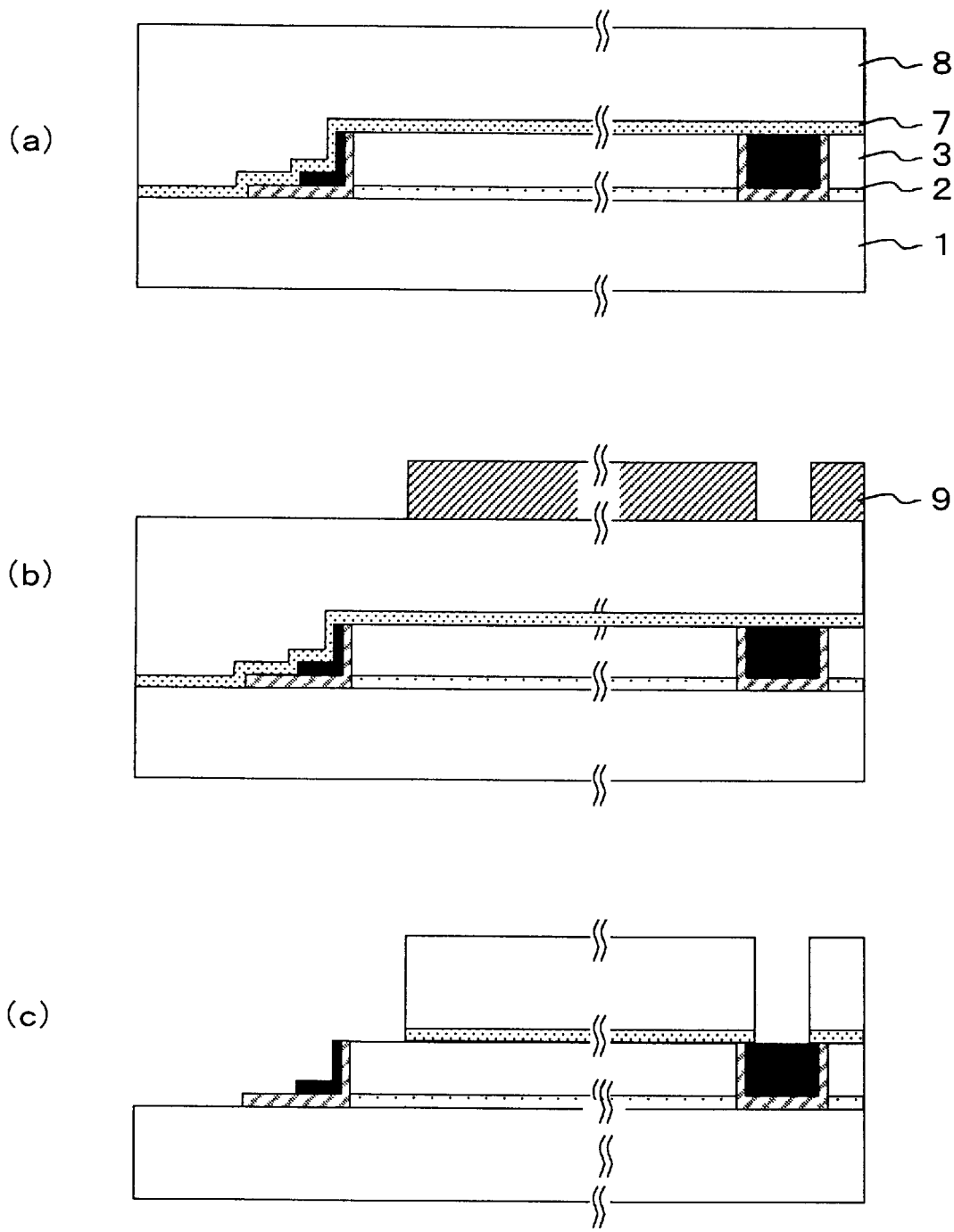
FIG. 12 is a series of schematic cross-sectional views illustrating further steps of the conventional forming method of copper interconnections.

In the above step, the circumference end part 61 of the photoresist 9 of FIG. 6(b) is set to be placed in an outer position than the circumference end part 60 of the silicon oxide film 3. This arrangement makes the circumference end part 62 of the silicon oxide film 8 placed in an outer position than the circumference end part 60 of the silicon oxide film 3 after the etching and produces a structure in which the polishing remains 21 are covered with the silicon oxide film 8 (FIG. 6(c)). This can prevent the films in the vicinity of the wafer edge from peeling off with effect. Hitherto, the width of the area from which a photoresist is removed by peripheral exposure has hardly attracted special attention and the widths are often set to be constant for every peripheral exposure or become larger in the later steps. The conventional method described referring to FIG. 12(b) to (c) is an example for the latter case. In contrast with this, the present embodiment sets the width of the area from which a mask is removed by peripheral exposure as described above, and thereby provides a structure in which polishing remains 21 generated in the wafer edge neighbouring region is covered with the silicon oxide film 8 (FIG. 6(c)). Here, the horizontal distance between the circumference end part 62 of the silicon oxide film 8 (the circumference end part 61 of the photoresist 4) and the circumference end part 60 of the silicon oxide film 3 is preferably set to be 1 to 3 mm. This can prevent effectively the afore-mentioned problem of peeling-off of the film from occurring without lowering the layout efficiency of the wafer.

Next, after a Ti/TiN layered film 10 is grown over the entire surface by the sputtering method, a tungsten film 11 is grown by the electroplating method, the CVD method or the like (FIG. 7(a)). After these films are grown, superfluous portions of the tungsten film 11 and the Ti/TiN layered film 10 are removed, by polishing, using the CMP so as to form an interlayer via plug. In the vicinity of the wafer edge (the left end in the drawing), hereat, some of the tungsten film 11 and the Ti/TiN layered film 10 are left behind in a stepped part and generates polishing remains. These polishing remains hardly bring about a problem of contamination or the like so that they are omitted from the drawings.

After that, in the same way as the steps described above, a silicon oxynitride film 12 (with a thickness of 50 nm or so) and a silicon oxide film 14 (with a thickness of 900 nm or so) are grown (FIG. 7(b)) and, over these films, a photoresist 15 is formed into a shape, wherein openings are made in a prescribed position of the element formation region as well as over the wafer edge neighbouring area (FIG. 8(b)). In this step, the position of the circumference end part 63 of the photoresist 15 may be set appropriately, but setting it in an inner position than the circumference end part 62 of the silicon oxide film 8 can make the area of the element formation region greater and preferable in view of the layout efficiency of the wafer. In the drawing, the circumference end part 63 of the photoresist 15 is set in almost the same position as the circumference end part 60 of the silicon oxide film 3.

Figure 9:
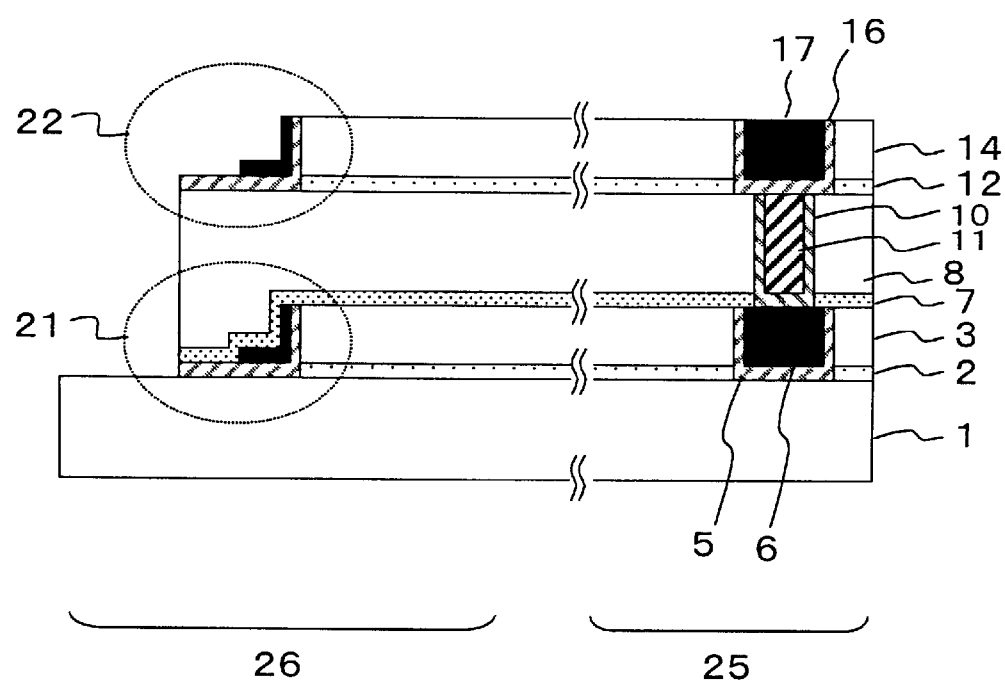
FIG. 9 is a schematic cross-sectional view illustrating further step of the forming method of copper interconnections according to the present invention.
Figure 10:
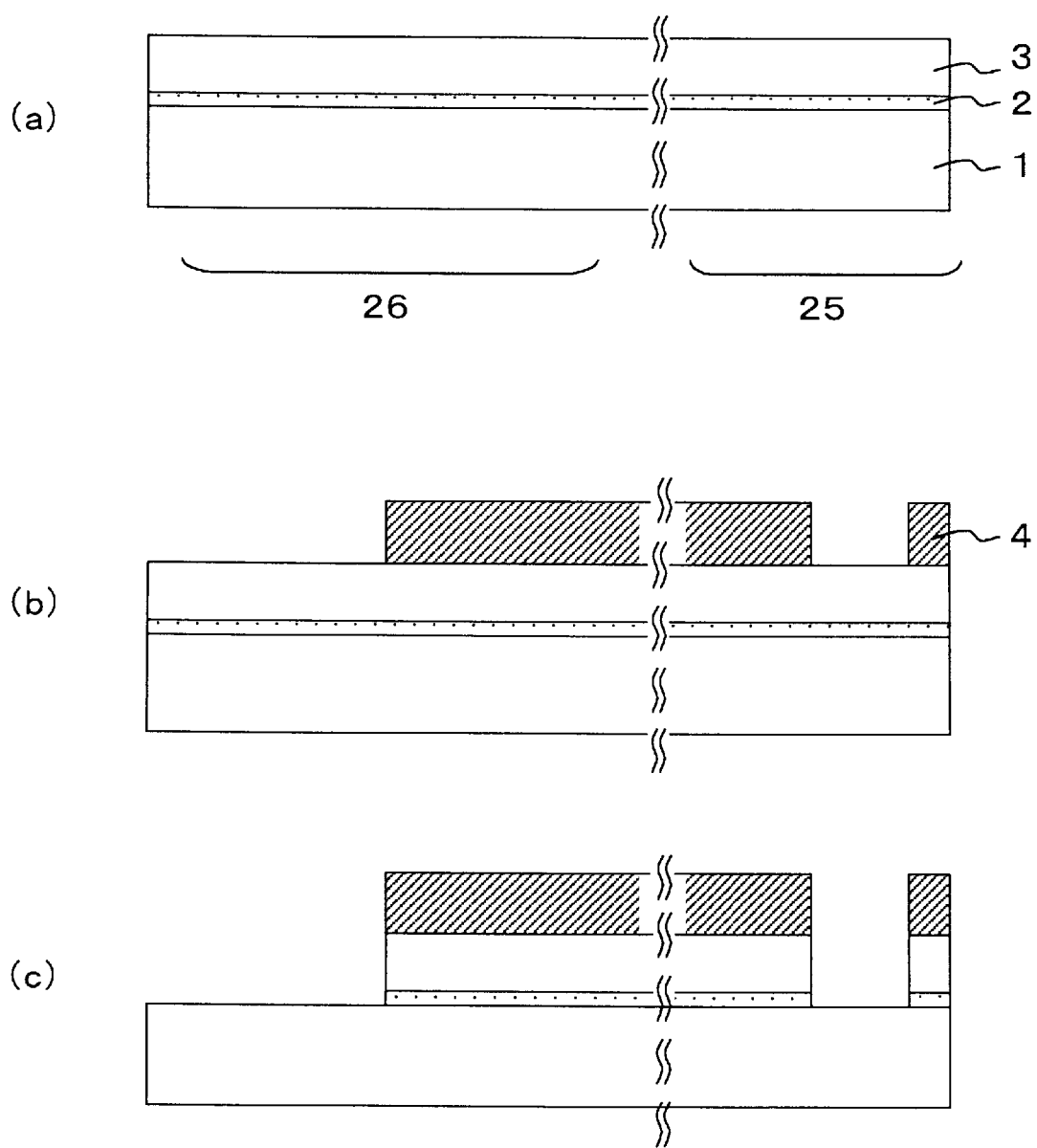
FIG. 10 is a series of schematic cross-sectional views illustrating the steps of a conventional forming method of copper interconnections.
Figure 11:
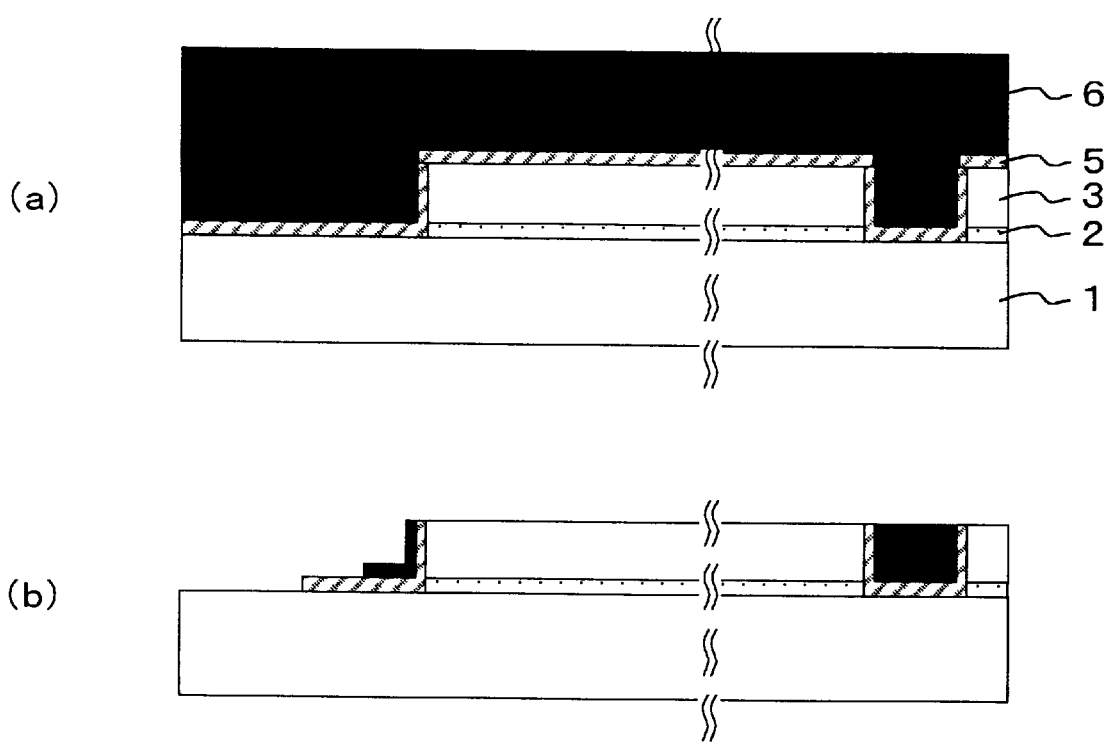
FIG. 11 is a series of schematic cross-sectional views illustrating further steps of the conventional forming method of copper interconnections.

After that, using this photoresist 15 as a mask, dry etching is performed and thereby a trench for formation of interconnection is formed in the element formation region and, at the same time, a silicon oxide film 14 and the like in the wafer edge neighbouring region are removed (FIG. 8(b)). Next, through the same steps a shown in FIGS. 5(a) and (b), a copper interconnection is formed that is made of a copper film 17 and a Ta film 16 (FIG. 9). So far, there is formed an interconnection structure in which two layers of copper interconnection are laid. A multi-layered structure having three or more layers can be formed by repeating the steps described above consecutively.

Because the steps described above makes the circumference end part of the silicon oxide film 8 placed in an outer position than the circumference end part of the silicon oxide film 3, a structure where polishing remains 21 of the Ta film 6 and the copper film 6 are covered with the silicon oxide film 8 in the vicinity of the wafer edge is attained (FIG. 9). In other words, a structure in which polishing remains 21 and polishing remains 22 are not directly in contact is achieved and besides polishing remains 21 of the lower layer is buried in the silicon oxide film in form. Accordingly, the above steps can prevent deposition of the copper film and the barrier metal film in the vicinity of the wafer edge and, consequently, prevent contamination that is caused by the peeling-off of these films with effect.

Figure 15:
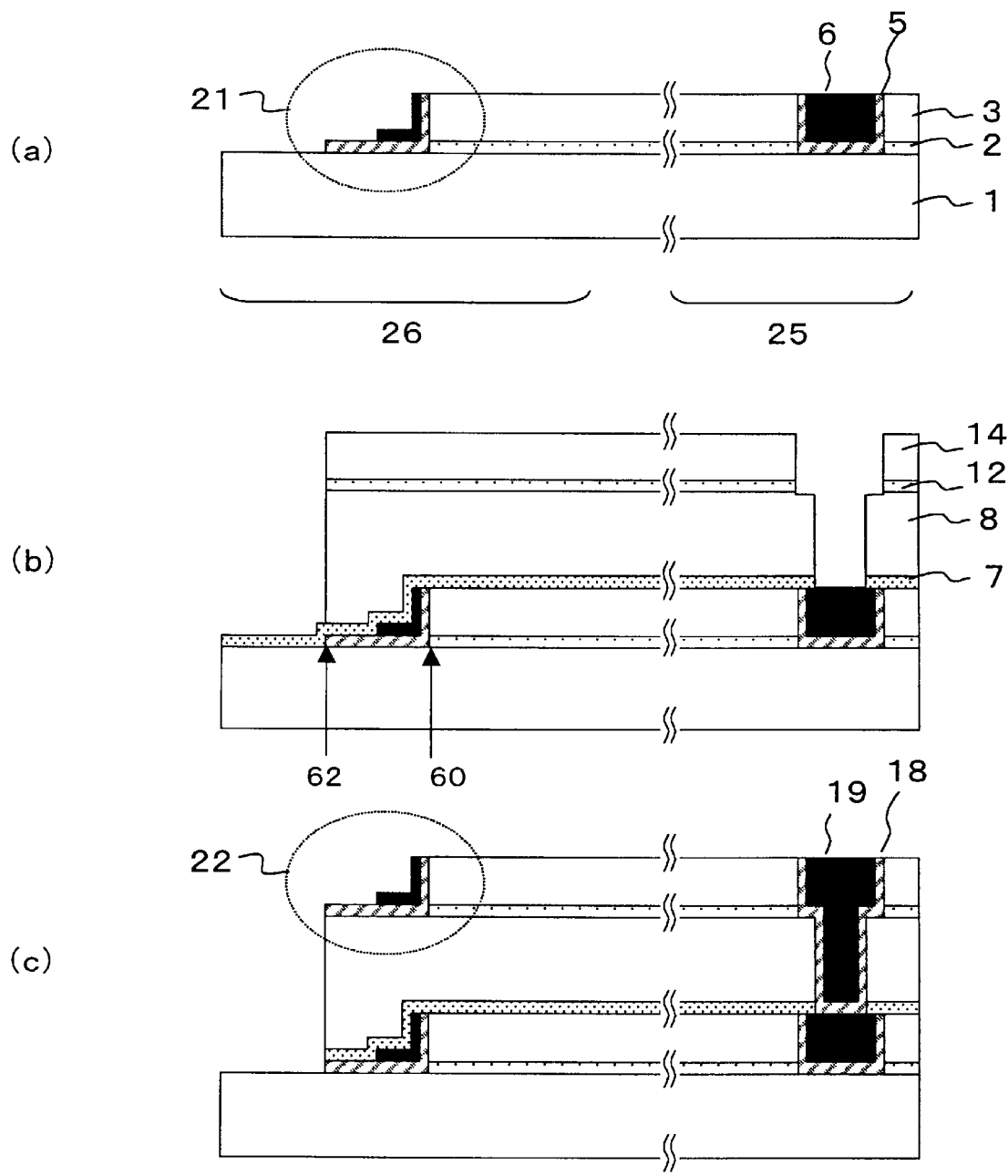
FIG. 15 is a series of schematic cross-sectional views illustrating the steps of another forming method of copper interconnections according to the present invention.
Figure 16:
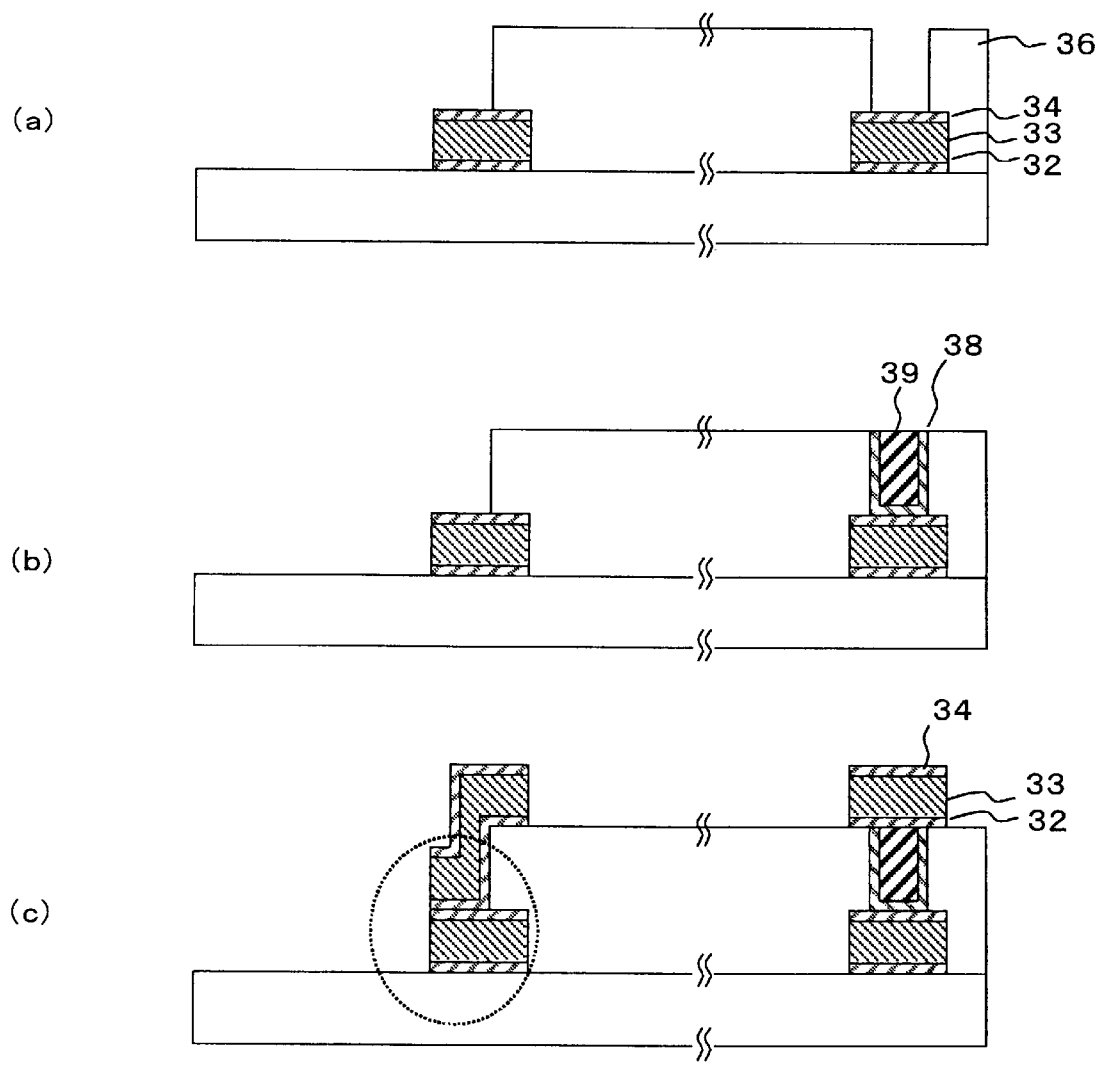
FIG. 16 is a series of schematic cross-sectional views illustrating the steps of another conventional forming method of copper interconnections.

An example of formation of multi-layered interconnections using a so-called single damascene process is described so far, but a dual damascene process can be utilized as well. In this case, copper interconnections and an interlayer via plug may be formed with a relatively simple and convenient process. Referring to FIG. 15, an example in which the present invention is applied to a dual damascene process is described below.

Figure 5:
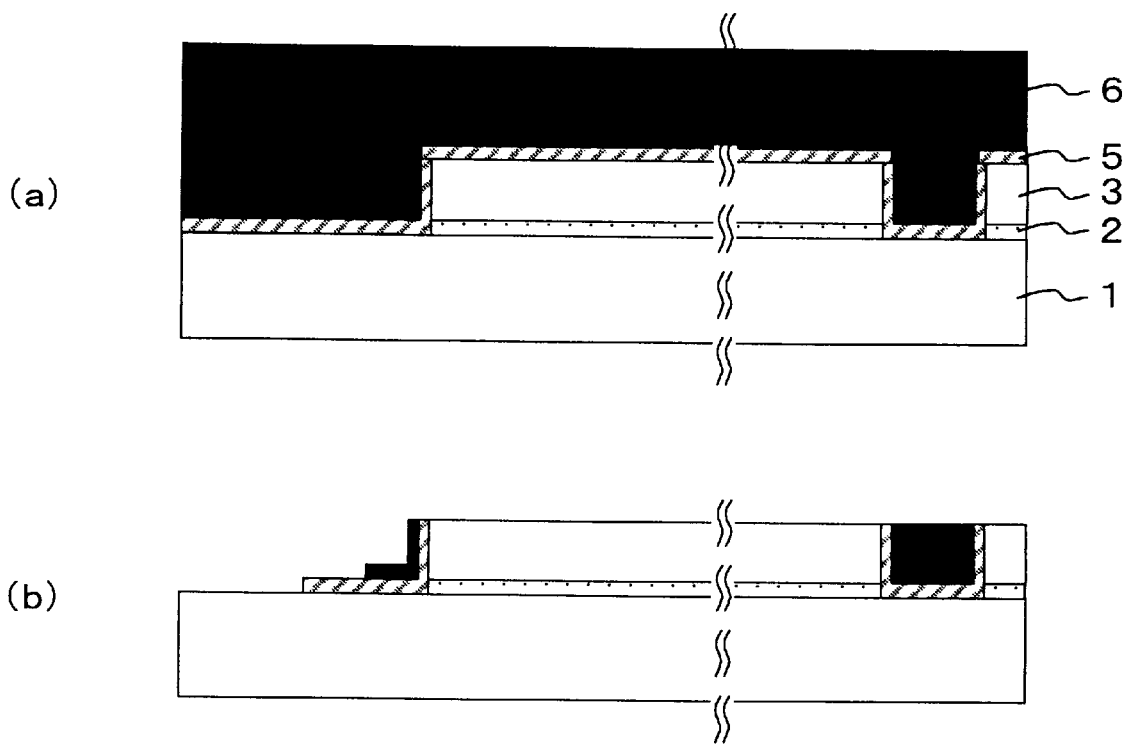
FIG. 5 is a series of schematic cross-sectional views illustrating further steps of the forming method of copper interconnections according to the present invention.
Figure 6:
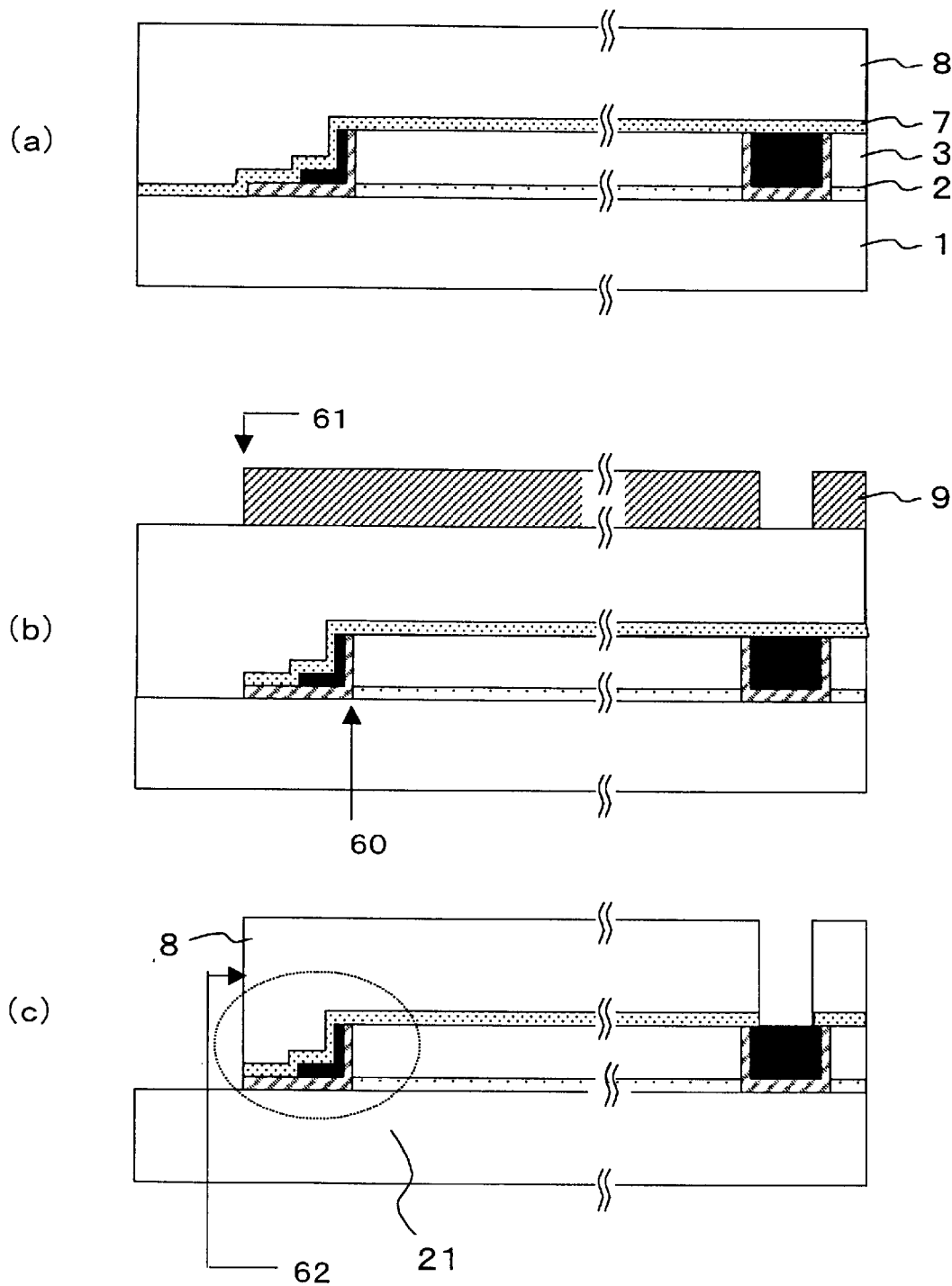
FIG. 6 is a series of schematic cross-sectional views illustrating further steps of the forming method of copper interconnections according to the present invention.
Figure 7:
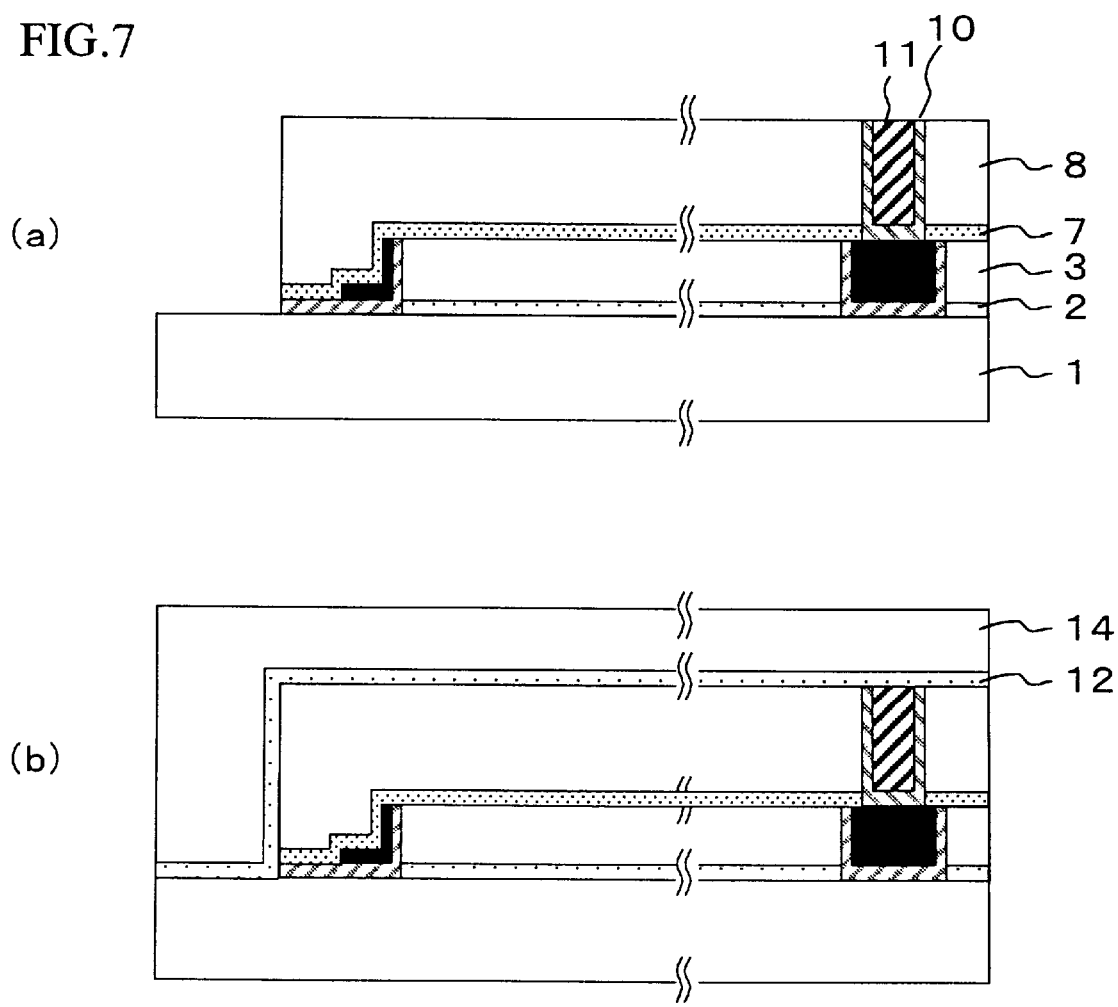
FIG. 7 is a series of schematic cross-sectional views illustrating further steps of the forming method of copper interconnections according to the present invention.
Figure 8:
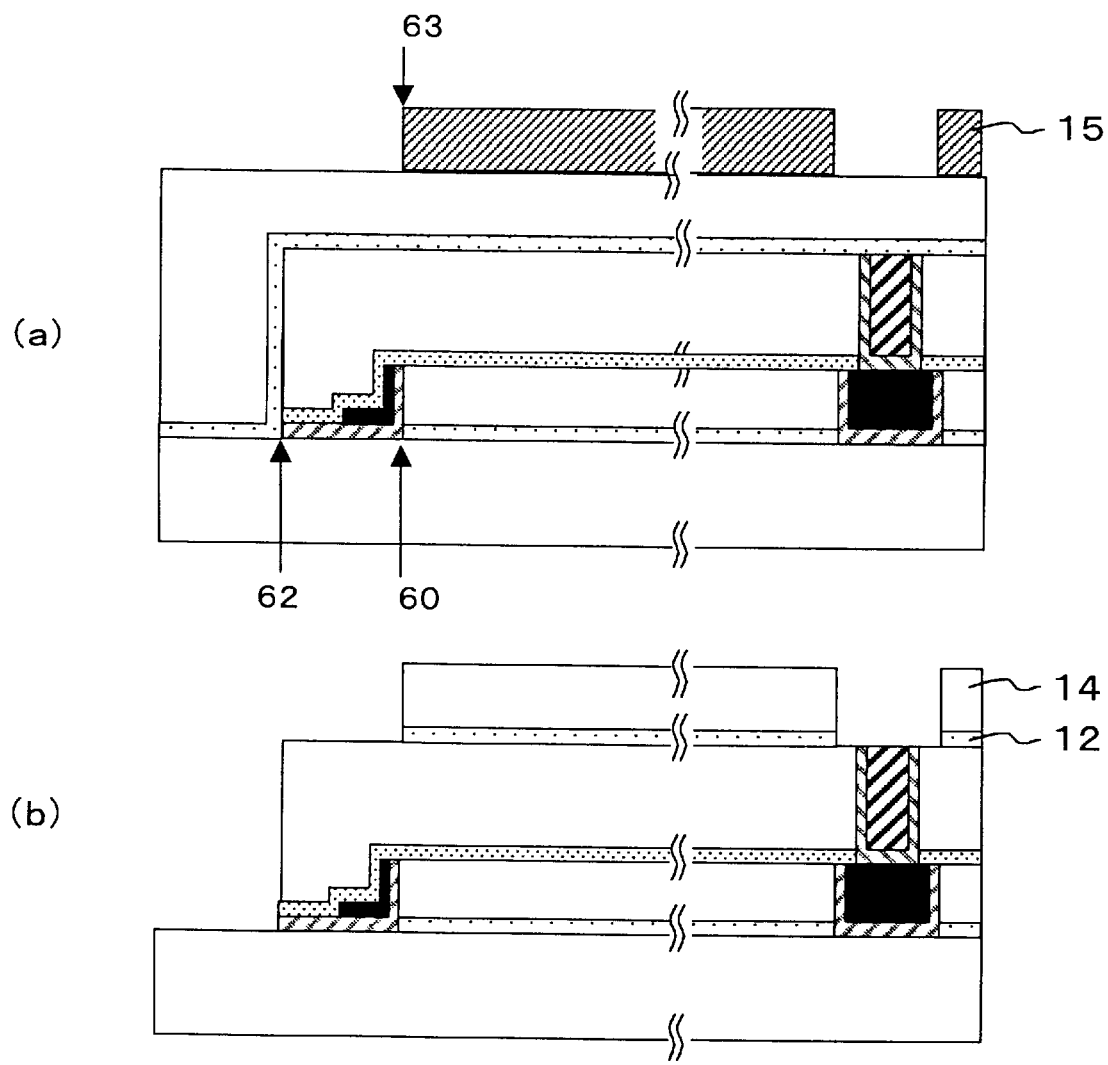
FIG. 8 is a series of schematic cross-sectional views illustrating further steps of the forming method of copper interconnections according to the present invention.

Firstly, after a silicon oxynitride film 2 and a silicon oxide film 3 are formed over an element formation layer 1 in which an element (not shown in the drawing) such as a transistor or the like is formed, a copper interconnection comprising a Ta film 5 and a copper film 6 is formed (FIG. 15(a)), through the similar steps of the film growth and the CMP to those in FIG. 5. Polishing remains 21 is hereat, generated in the wafer edge neighbouring area 26.

Next, through etching, a sectionally T-shaped through hole is formed in the element formation region 25, and at the same time, a silicon oxide film 8 in the wafer edge neighbouring area 26 is removed (FIG. 15(b)). The circumference end part 62 of the silicon oxide film 8 after etching is, hereat, made to be placed in an outer position than the circumference end part 60 of the silicon oxide film 3 (FIG. 15(b)). After that, using the damascene process, a copper interconnection comprising a Ta film 18 and a copper film 19 is formed (FIG. 15(c)).

In the structure shown in FIG. 15(c), the polishing remains 21 are covered with the silicon oxide film 8, whereby the film in the vicinity of the wafer edge can be prevented from peeling off effectively. The horizontal distance between the circumference end part 62 of the silicon oxide film 8 and the circumference end part 60 of the silicon oxide film 3 is preferably set to be 1 to 3 mm. This can prevent effectively the aforementioned problem of peeling-off of the film from occurring without lowering the layout efficiency of the wafer.

As described above, in the present invention, when a second insulating film is formed over a first insulating film in which a copper interconnection is formed, the circumference end part of the second insulating film is made to be pace in an outer position than the circumference end part of the first insulating film. This arrangement can effectively prevent a layered body of copper film and barrier metal film from being generated in the vicinity of the wafer edge and, in consequence, prevent contamination that is caused by the peeling-off of these films.

This application is based on Japanese patent application NO.HEI11-248635, the content of which is incorporated hereinto by reference.

What is claimed is:

1. A method of forming a copper interconnection among semiconductor devices disposed on a circular semiconductor wafer, the method comprising:

forming a first insulating film on an entire surface of the semiconductor wafer, and thereafter together with forming at least one trench within an inner portion of the first insulating film by etching, removing an outer circumferential portion of the first insulating film on the semiconductor wafer, so as to make the circumference of the first insulating film smaller than the circumference of the semiconductor wafer;

forming a barrier metal film and a copper film, in this order, over the entire surface of the semiconductor wafer, and thereafter polishing the barrier metal and copper films by means of chemical mechanical polishing, and thereby forming a copper interconnection in said trench; and forming a second insulating film on the entire surface of the semiconductor wafer, and thereafter, removing an outer circumferential portion of the second insulating film on the semiconductor wafer, so as to make the circumference of the second insulating film smaller than the circumference of the semiconductor wafer and larger than the circumference of the first insulating film, wherein the second insulating film is formed over polishing remains of the barrier metal film and the copper film located beyond the circumference of the first insulating film.

2. The method of forming a copper interconnection among semiconductor devices disposed on a circular semiconductor wafer as claimed in claim 1, wherein the method of forming the copper interconnection among the semiconductor devices disposed on the circular semiconductor wafer is repeated two or more times on the circular semiconductor wafer.

3. The method of forming a copper interconnection among semiconductor devices disposed on a circular semiconductor wafer as claimed in claim 2, wherein for a repetition of the method and a next repetition of the method, the circumference of the second insulating film after removing the outer circumferential portion of the second insulating film for the repetition of the method is larger than the circumference of the first insulating film after removing the outer circumferential portion of the first insulating film for the next repetition of the method.

4. The method of forming a copper interconnection among semiconductor devices disposed on a circular semiconductor wafer as claimed in claim 1, wherein said barrier metal film contains at least one of tantalum and titanium.

5. The method of forming a copper interconnection as claimed in claim 1, wherein a radial distance between the circumference of the first insulating film after removing an outer circumferential portion of the first insulating film on the semiconductor wafer and the circumference of the second insulating film after removing an outer circumferential portion of the second insulating film on the semiconductor wafer is not less than 1 mm.

* * * * *